(12) United States Patent
Chen et al.

(10) Patent No.: US 10,465,069 B2
(45) Date of Patent: Nov. 5, 2019

(54) POLYPHENYL ETHER RESIN COMPOSITION AND PREPREG, LAMINATED BOARD AND PRINTED CIRCUIT BOARD CONTAINING SAME

(71) Applicant: Shengyi Technology Co., Ltd., Guangdong (CN)

(72) Inventors: Guangbing Chen, Guangdong (CN); Xianping Zeng, Guangdong (CN)

(73) Assignee: Shengyi Technology Co., Ltd., Guangdong (CN)

( * ) Notice: Subject to any disclaimer, the term of this patent is extended or adjusted under 35 U.S.C. 154(b) by 0 days.

(21) Appl. No.: 15/744,579

(22) PCT Filed: Apr. 8, 2016

(86) PCT No.: PCT/CN2016/078808
§ 371 (c)(1),
(2) Date: Jan. 12, 2018

(87) PCT Pub. No.: WO2017/067139
PCT Pub. Date: Apr. 27, 2017

(65) Prior Publication Data
US 2019/0002689 A1 Jan. 3, 2019

(30) Foreign Application Priority Data
Oct. 22, 2015 (CN) .......................... 2015 1 0701719

(51) Int. Cl.
| | |
|---|---|
| C08L 71/12 | (2006.01) |
| B32B 27/00 | (2006.01) |
| C08J 5/24 | (2006.01) |
| C08L 9/06 | (2006.01) |
| B32B 27/28 | (2006.01) |
| C08L 25/10 | (2006.01) |
| H05K 1/03 | (2006.01) |

(52) U.S. Cl.
CPC ............ *C08L 71/126* (2013.01); *B32B 27/00* (2013.01); *B32B 27/285* (2013.01); *C08J 5/24* (2013.01); *C08L 9/06* (2013.01); *C08L 25/10* (2013.01); *C08L 71/12* (2013.01); *H05K 1/0366* (2013.01); *B32B 2305/076* (2013.01); *C08J 2325/10* (2013.01); *C08J 2371/12* (2013.01); *C08J 2409/00* (2013.01); *C08J 2409/06* (2013.01); *C08J 2425/10* (2013.01); *C08J 2447/00* (2013.01); *C08J 2471/12* (2013.01); *C08L 2312/02* (2013.01); *H05K 1/034* (2013.01); *H05K 1/0373* (2013.01); *H05K 2201/012* (2013.01); *H05K 2201/015* (2013.01); *H05K 2201/0129* (2013.01)

(58) Field of Classification Search
CPC ....... C08L 71/126; C08J 2325/10; C08J 5/24; C08J 2371/12; B32B 2305/076
See application file for complete search history.

(56) References Cited

U.S. PATENT DOCUMENTS

| | | | |
|---|---|---|---|
| 9,051,465 B1 * | 6/2015 | Almen ................... | B32B 5/022 |
| 2004/0001961 A1 | 1/2004 | Ono et al. | |
| 2011/0294966 A1 | 12/2011 | O'Brien et al. | |
| 2014/0113118 A1 * | 4/2014 | Wang .................. | H05K 1/0353 |
| | | | 428/209 |

FOREIGN PATENT DOCUMENTS

| | | |
|---|---|---|
| CN | 101589109 A | 11/2009 |
| CN | 102807658 A | 12/2012 |
| CN | 103965606 A | 8/2014 |
| JP | 2005015613 A | 1/2005 |

OTHER PUBLICATIONS

International Search Report issued in PCT/CN2016/078808 dated Jun. 28, 2016.

* cited by examiner

*Primary Examiner* — Nicholas E Hill
(74) *Attorney, Agent, or Firm* — Norton Rose Fulbright US LLP; James Crawford

(57) ABSTRACT

Provided are a polyphenyl ether resin composition and a prepreg and a laminated board containing same. The polyphenyl ether resin composition comprises the following components: (1) a tetrafunctional or higher multifunctional acrylate-modified thermosetting polyphenyl ether resin; and (2) a vinyl resin cross-linking agent, the weight of the vinyl resin cross-linking agent being 40-100 parts by weight based on 100 parts by weight of the tetrafunctional or higher multifunctional acrylate-modified thermosetting polyphenyl ether resin. The modified thermosetting polyphenyl ether resin, due to containing a tetrafunctional or higher multifunctional acrylate active group, can cross-link more vinyl resin cross-linking agents. Not only the prepared high-speed electronic circuit substrate has low dielectric constant and dielectric loss, but also double bonds in side chains of the vinyl resin cross-linking agent are reacted completely in a resin curing system, so that the high-speed electronic circuit substrate has a better thermo-oxidative aging resistance.

20 Claims, No Drawings

POLYPHENYL ETHER RESIN COMPOSITION AND PREPREG, LAMINATED BOARD AND PRINTED CIRCUIT BOARD CONTAINING SAME

CROSS REFERENCE TO RELATED APPLICATIONS

This application is a § 371 of International Application No. PCT/CN2016/078808 filed Apr. 8, 2016, and claims priority from Chinese Patent Application No. 201510701719.2 filed Oct. 22, 2015.

TECHNICAL FIELD

The present disclosure belongs to the technical field of copper-clad laminates, specifically relates to a polyphenyl ether resin composition and a prepreg, a laminate and a printed-circuit board containing the same.

BACKGROUND

In recent years, due to the development of electronic information technology, the miniaturization and densification of electronic equipment installation, the large capacity of information, the high frequency and high speed of transmission signals, and the fact that the transmission lines of electronic circuit board applied in the hardware devices of the high-end communication network such as routers, switches and servers, etc. become longer and longer, the electronic circuit substrate is required to have a lower dielectric constant and a lower dielectric loss.

For high-speed electronic circuit substrate, during its long-term use, maintaining the stability of the dielectric constant and the dielectric loss of the substrate will produce a significant impact on the change in characteristic impedance and the signal integrity of the substrate. The stability of the dielectric constant and the dielectric loss contains three aspects: temperature drift, wet drift and thermal-oxidative aging resistance of the dielectric constant and the dielectric loss.

For the thermal-oxidative aging property, in the resin curing system of a substrate, both the dielectric constant and the dielectric loss of the substrate will increase since the thermal-oxidative aging will occur during the long-term use of the resin, thereby affecting its stability, the signal integrity of the substrate will be deteriorated ultimately. Therefore, the good thermal-oxidative aging resistance of the resin curing system of a substrate is an important performance requirement for the high-speed electronic circuit substrate.

Because the acrylate group-modified thermosetting polyphenyl ether resin contains a large number of benzene ring structure without strong polar group in its molecular structure, which imparts excellent properties to the polyphenyl ether resin, such as high glass transition temperature, good dimensional stability small thermal expansion coefficient, low water absorption, especially outstandingly low dielectric constant and low dielectric loss, it becomes the ideal resin material for the preparation of the high-speed circuit substrate.

Since the vinyl resin crosslinking agent such as butadiene-styrene copolymer has no polar group in its molecular chain structure, it has excellently low dielectric constant and low dielectric loss, and is usually used as a crosslinking agent for the preparation of the high-speed circuit substrate.

CN103965606A discloses a low-k material comprising: 40 to 80 parts by weight of polyphenyl ether; 5 to 30 parts by weight of bismaleimide; and 5 to 30 parts by weight of a polymeric additive. The polyphenyl ether used in the disclosure is a bifunctional acrylate group-modified thermosetting polyphenyl ether resin, and the polymeric additive comprises a hydrocarbon resin such as polybutadiene and butadiene-styrene copolymer, which can be used for the preparation of the high-speed circuit substrate.

CN102807658A discloses a group of polyphenyl ether resin composition comprising: a functionalized polyphenyl ether; a crosslinking curing agent; and an initiator. The polyphenyl ether used in the disclosure is a bifunctional acrylate group-modified thermosetting polyphenyl ether resin, and the crosslinking curing agent comprises a hydrocarbon resin such as polybutadiene and butadiene-styrene copolymer, which can be used for the preparation of the high-speed circuit substrate.

CN101589109A discloses a group of polyphenyl ether resin composition comprising: a functionalized poly(arylene ether); a vinyl thermosetting resin; and a flame retardant composition. The polyphenyl ether used in the disclosure is a bifunctional acrylate group-modified thermosetting polyphenyl ether resin, and the vinyl thermosetting resin is such as polybutadiene and butadiene-styrene copolymer, which can be used for the preparation of the high-speed circuit substrate.

The above related technics have the following problems: in order to obtain a lower dielectric constant and a lower dielectric loss, it is necessary to increase the use ratio of the vinyl resin crosslinking agent such as polybutadiene. The bifunctional acrylate group-modified thermosetting polyphenyl ether resin has a limited number of acrylate groups, which is unable to make an excess amount of double bonds on the side chains of the vinyl resin crosslinking agent such as polybutadiene react completely, although the prepared substrate has a lower dielectric constant and a lower dielectric loss. The incompletely reacted double bonds on the side chains of the vinyl resin crosslinking agent such as polybutadiene has poor thermal-oxidative aging resistance, which can seriously affect the stability of the dielectric constant and the dielectric loss of the substrate during the long-term use, thereby deteriorating the signal integrity of the substrate, so that the customers' needs cannot be satisfied.

SUMMARY

In terms of the problems existing in the related technics, it is an object of the present disclosure to provide a polyphenyl ether resin composition. A high-speed electronic circuit substrate (a copper-clad laminate) obtained using the composition has not only low dielectric constant and dielectric loss, but also good thermal-oxidative aging resistance, so that the dielectric constant and the dielectric loss of the substrate can remain stable during the long-term use.

In order to achieve the above object, the present disclosure adopts the following technical solution:

A polyphenyl ether resin composition comprising:

(1) a tetrafunctional or higher multifunctional acrylate group-modified thermosetting polyphenyl ether resin; and (2) a vinyl resin crosslinking agent, the weight of which is 40 to 100 parts by weight, based on 100 parts by weight of the tetrafunctional or higher multifunctional acrylate group-modified thermosetting polyphenyl ether resin;

wherein the tetrafunctional or higher multifunctional acrylate group-modified thermosetting polyphenyl ether resin has a structure shown by formula (1):

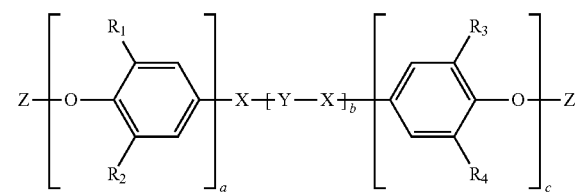

Formula (1)

in formula (1), $R_1$, $R_2$, $R_3$ and $R_4$ are the same or different and are each independently a hydrogen atom, a halogen atom, a substituted or unsubstituted C1-C8 (for example, C2, C3, C4, C5, C6, C7 or C8) alkyl group or a substituted or unsubstituted aryl group.

a and c are each independently an integer from 1 to 15, and b is an integer from 2 to 10, preferably an integer from 4 to 6.

a is for example 2, 3, 4, 5, 6, 7, 8, 9, 10, 11, 12, 13 or 14, c is for example 2, 3, 4, 5, 6, 7, 8, 9, 10, 11, 12, 13 or 14, and b is for example 2, 3, 4, 5, 6, 7, 8 or 9.

Z has a structure shown by formula (2):

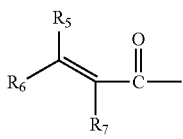

Formula (2)

in formula (2), $R_5$, $R_6$, and $R_7$ are the same or different and are each independently a hydrogen atom or a substituted or unsubstituted C1-C10 (for example, C2, C3, C4, C5, C6, C7, C8 or C9) alkyl group.

X has a structure shown by formula (3), formula (4), formula (5), or formula (6):

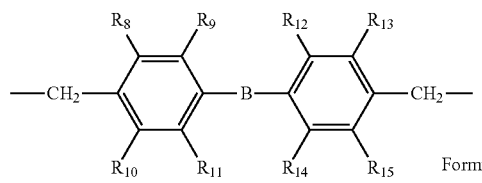

Formula (3)

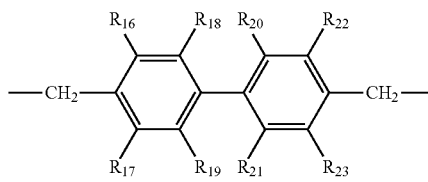

Formula (4)

Formula (5)

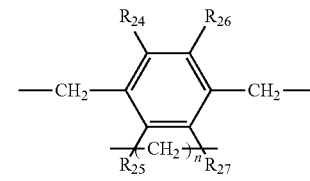

Formula (6)

$R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$, $R_{25}$, $R_{26}$, and $R_{27}$ are the same or different and are each independently a hydrogen atom, a halogen atom, a substituted or unsubstituted C1-C8 (for example, C2, C3, C4, C5, C6, C7 or C8) alkyl group or a substituted or unsubstituted aryl group; n is an integer from 1 to 10, for example 2, 3, 4, 5, 6, 7, 8, 9 or 10; B is an alkylene group, —O—, —CO—, —SO—, —SC—, —SO$_2$— or —C(CH$_3$)$_2$—.

Y has a structure shown by formula (7) or formula (8):

Formula (7)

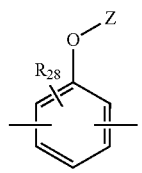

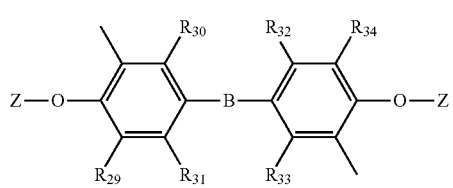

Formula (8)

$R_{28}$, $R_{29}$, $R_{30}$, $R_{31}$, $R_{32}$, $R_{33}$ and $R_{34}$ are the same or different and are each independently a hydrogen atom, a halogen atom, a substituted or unsubstituted C1-C8 (for example, C2, C3, C4, C5, C6, C7 or C8) alkyl group or a substituted or unsubstituted aryl group, and B and Z are selected as described above.

In the present disclosure, since the modified thermosetting polyphenyl ether resin contains tetrafunctional or higher multifunctional (meth)acrylate active groups to crosslink more vinyl resin crosslinking agents, the prepared high-speed electronic circuit substrate has not only a low dielectric constant and dielectric loss, but also better thermal-oxidative aging resistance due to the fact that double bonds on the side chains of the vinyl resin crosslinking agent can react completely in the resin curing system, so that the dielectric constant and the dielectric loss of the substrate can maintain good stability during a long-term use. In the present disclosure, a low dielectric constant and dielectric loss as well as an excellent thermal-oxidative aging resistance can be achieved simultaneously through the cooperation relationship between the addition amount of the acrylate group-modified thermosetting polyphenyl ether resin with specific functionality and that of the specific vinyl resin crosslinking agent.

In addition, in the present disclosure, since the active groups, i.e., the acrylate groups contained in the tetrafunctional or higher multifunctional acrylate group-modified thermosetting polyphenyl ether resin are all grafted onto the phenoxyl group, and the thermal-oxidative aging property of the phenoxyl group is superior to the aliphatic chains in the secondary or tertiary carbon atom structure, the thermal-oxidative aging property of the high-speed electronic circuit substrate prepared therefrom is superior to that of the multifunctional acrylate group-modified thermosetting polyphenyl ether resin of which the active group, i.e., the acrylate groups are all grafted onto the aliphatic chains such as the secondary or tertiary carbon atoms, so that the dielectric constant and the dielectric loss of the high-speed electronic circuit substrate prepared therefrom can maintain better stability during a long-term use.

Moreover, by selecting the b value to be 2 to 10, the present disclosure also overcomes the problem that the molecular weight of the polyphenyl ether is too large to dissolve easily due to the too high functionality, and even if it dissolves, the viscosity of the glue is high.

The weight of the vinyl resin crosslinking agent is, for example 45 parts by weight, 50 parts by weight, 55 parts by weight, 60 parts by weight, 65 parts by weight, 70 parts by weight, 75 parts by weight, 80 parts by weight, 85 parts by weight, 90 parts by weight or 95 parts by weight, and preferably, based on 100 parts by weight of the tetrafunctional or higher multifunctional acrylate group-modified thermosetting polyphenyl ether resin, the weight of the vinyl resin crosslinking agent is 50 to 80 parts by weight.

Preferably, the number average molecular weight of the tetrafunctional or higher multifunctional acrylate group-modified thermosetting polyphenyl ether resin is 500 to 10000 g/mol, preferably 800 to 8000 g/mol, and further preferably 1000 to 4000 g/mol.

Preferably, the vinyl resin crosslinking agent is any one or a mixture of at least two selected from a group consisting of a styrene-butadiene copolymer, a polybutadiene or a styrene-butadiene-divinylbenzene copolymer.

Preferably, the styrene-butadiene copolymer, the polybutadiene or the styrene-butadiene-divinylbenzene copolymer are independently amino-modified, maleic anhydride-modified, epoxy-modified, acrylate-modified, hydroxyl-modified or carboxyl-modified. That is, the vinyl resin crosslinking agent is any one or a mixture of at least two selected from a group consisting of amino-modified, maleic anhydride-modified, epoxy-modified, acrylate-modified, hydroxyl-modified, and carboxyl-modified styrene-butadiene copolymer, polybutadiene or styrene-butadiene-divinylbenzene copolymer.

The exemplary vinyl resin crosslinking agent is, for example the styrene-butadiene copolymer (Ricon100, available from Samtomer), and polybutadiene B-1000 (available from Nippon Soda).

Preferably, the polyphenyl ether resin composition further comprises an initiator, and the initiator is a radical initiator.

Preferably, the radical initiator is selected from an organic peroxide initiator, further preferably any one or a mixture of at least two selected from a group consisting of dilauroyl peroxide, dibenzoyl peroxide, cumyl peroxyneodecanoate, t-butyl peroxyneodecanoate, t-amyl peroxypivalate, t-butyl peroxypivalate, t-butyl peroxyisobutyrate, t-butyl peroxy-3,5,5-trimethylhexanoate, t-butyl peroxyacetate, t-butyl peroxybenzoate, 1,1-di-t-butylperoxy-3,5,5-trimethylcyclohexane, 1,1-di-t-butylperoxycyclohexane, 2,2-bis(t-butylperoxy)butane, bis(4-tert-butylcyclohexyl) peroxydicarbonate, hexadecyl peroxodicarbonate, tetradecyl peroxydicarbonate, di-t-amyl peroxide, dicumyl peroxide, bis(t-butylperoxyisopropyl)benzene, 2,5-dimethyl-2,5-di-t-butylperoxyhexane, 2,5-dimethyl-2,5-di-t-butylperoxyhexyne, dicumyl hydroperoxide, cumyl hydroperoxide, t-amyl hydroperoxide, t-butyl hydroperoxide, t-butyl cumyl peroxide, dicumyl hydroperoxide, t-butyl peroxycarbonate 2-ethylhexanoate, 2-ethylhexyl-t-butylperoxycarbonate, n-butyl 4,4-di(t-butylperoxy)pentanoate, methyl ethyl ketone peroxide or cyclohexane peroxide.

Preferably; the weight of the initiator is 1 to 3 parts by weight, for example, 1.2 parts by weight, 1.4 parts by weight, 1.6 parts by weight, 1.8 parts by weight, 2.0 parts by weight, 2.2 parts by weight, 2.4 parts by weight, 2.6 parts by weight or 2.8 parts by weight, based on 100 parts by weight of a sum of the weight of the tetrafunctional or higher multifunctional acrylate group-modified thermosetting polyphenyl ether resin and the vinyl resin crosslinking agent.

Preferably, the polyphenyl ether resin composition further comprises a flame retardant.

Preferably, the flame retardant is a bromine-containing flame retardant and/or a phosphorus-containing flame retardant.

Preferably, the weight of the flame retardant is 0 to 40 parts by weight, for example 0.5 parts by weight, 4 parts by weight, 8 parts by weight, 12 parts by weight, 16 parts by weight, 20 parts by weight, 24 parts by weight, 28 parts by weight, 32 parts by weight or 36 parts by weight, based on 100 parts by weight of a sum of the weight of the tetrafunctional or higher multifunctional acrylate group-modified thermosetting polyphenyl ether resin, the vinyl resin crosslinking agent and the initiator.

Preferably, the polyphenyl ether resin composition further comprises a powder filler.

Preferably, the powder filler is an organic filler and/or an inorganic filler.

Preferably, the inorganic filler is any one or a mixture of at least two selected from a group consisting of crystalline silica, fused silica, spherical silica, hollow silica, glass frit, aluminum nitride, boron nitride, silicon carbide, aluminum silicon carbide, aluminum hydroxide, magnesium hydroxide, titanium dioxide, strontium titanate, barium titanate, zinc oxide, zirconium oxide, aluminum oxide, beryllium oxide, magnesium oxide, barium sulfate, talcum powder, clay, calcium silicate, calcium carbonate or mica.

Preferably, the organic filler is any one or a mixture of at least two selected from a group consisting of polytetrafluoroethylene powder, polyphenylene sulfide, polyetherimide, polyphenyl ether or polyether sulfone powder.

Preferably, the weight of the powder filler is 0 to 150 parts by weight, for example 5 parts by weight, 10 parts by weight, 20 parts by weight, 30 parts by weight, 40 parts by weight, 50 parts by weight, 60 parts by weight, 70 parts by weight, 80 parts by weight, 90 parts by weight, 100 parts by weight, 110 parts by weight, 120 parts by weight, 130 parts by weight or 140 parts by weight, based on 100 parts by weight of a sum of the weight of the tetrafunctional or higher multifunctional acrylate group-modified thermosetting polyphenyl ether resin, the vinyl resin crosslinking agent, the initiator and the flame retardant.

The term "comprise(s)", "comprising", "contain(s)", or "containing" as used in the present disclosure means that in addition to the described components, other components may be included, which impart different characteristics to the polyphenyl ether resin composition. Besides, the term "comprise(s)", "comprising", "contain(s)", or "containing" as used in the present disclosure can also be replaced by the closed-ended phrase "is (are)", "consist(s) of . . . of" or "consisting . . . of".

For example, the polyphenyl ether resin composition may contain various additives. As specific examples, a coupling agent, an antioxidant, a heat stabilizer, an antistatic agent, an ultraviolet absorbent, a pigment, a colorant or a lubricant, etc. can be listed. These various additives may be used singly or in a combination of two or more.

Another object of the present disclosure is to provide a prepreg made of the polyphenyl ether resin composition, which comprises a reinforcing material and the polyphenyl ether resin composition as described above adhered thereon after being impregnated and dried.

Another object of the present disclosure is to provide a laminate, which comprises at least one prepreg as described above.

Yet another object of the present disclosure is to provide a copper-clad laminate made of the polyphenyl ether resin composition, which comprises at least one prepreg as described above and a metal foil clad on one or both sides of the laminated prepreg.

Still another object of the present disclosure is to provide a printed-circuit board, which comprises at least one prepreg as described above.

A method for preparing an exemplary high-speed electronic circuit substrate, i.e., a copper-clad laminate, it comprises the following steps:

(1) Weighing the resin composition raw materials: based on 100 parts by weight of the weight of the tetrafunctional or higher multifunctional acrylate group-modified thermosetting polyphenyl ether resin, the weight of the vinyl resin crosslinking agent is 40 to 100 parts by weight; based on 100 parts by weight of a sum of the weight of the tetrafunctional or higher multifunctional acrylate group-modified thermosetting polyphenyl ether resin and the vinyl resin crosslinking agent, the weight of the initiator is 1 to 3 parts by weight; based on 100 parts by weight of a sum of the weight of the tetrafunctional or higher multifunctional acrylate group-modified thermosetting polyphenyl ether resin, the vinyl resin crosslinking agent and the initiator, the weight of the flame retardant is 0 to 40 parts by weight; based on 100 parts by weight of a sum of the weight of the tetrafunctional or higher multifunctional acrylate group-modified thermosetting polyphenyl ether resin, the vinyl resin crosslinking agent, the initiator and the flame retardant, the weight of the powder filler is 0 to 150 parts by weight;

(2) Mixing the tetrafunctional or higher multifunctional acrylate group-modified thermosetting polyphenyl ether resin, the vinyl resin crosslinking agent, the initiator, the powder filler and the flame retardant, and adding an appropriate amount of solvent, then stirring and dispersing evenly to uniformly disperse the powder filler and the flame retardant in the glue solution. A reinforcing material such as a glass fabric cloth is impregnated with the prepared glue solution and dried in an oven at a suitable temperature for a certain period of time to remove the solvent, thereby forming a prepreg;

(3) Neatly overlapping at least one prepreg with copper foils disposed on its top and bottom, laminating and curing in a press to obtain the high-speed electronic circuit substrate, i.e., the copper-clad laminate.

Compared with the related technics, the present disclosure has the following beneficial effects:

In the present disclosure, since the modified thermosetting polyphenyl ether resin contains tetrafunctional or higher multifunctional (meth)acrylate active groups to crosslink more vinyl resin crosslinking agents, the prepared high-speed electronic circuit substrate has not only a low dielectric constant and dielectric loss, but also better thermal-oxidative aging resistance due to the fact that the double bonds on the side chains of the vinyl resin crosslinking agent can react completely in the resin curing system, so that the dielectric constant and the dielectric loss of the substrate can maintain good stability during a long-term use. In the present disclosure, a low dielectric constant (10 GHz, ≤3.8) and a dielectric loss (10 GHz, ≤0.0052) as well as an excellent thermal-oxidative aging resistance (thermal-oxidative aging resistance of 150° C./56 day with absolute value of change in Dk≤0.3, and thermal-oxidative aging resistance of 150° C./56 day with absolute value of change in Df≤0.004) can be achieved simultaneously through the coordination relationship between the addition amount of the acrylate group-modified thermosetting polyphenyl ether resin with specific functionality and that of the specific vinyl resin crosslinking agent.

In addition, in the present disclosure, since the active group, i.e., the acrylate groups contained in the tetrafunctional or higher multifunctional acrylate group-modified thermosetting polyphenyl ether resin are all grafted onto the phenoxyl group, and the thermal-oxidative aging property of the phenoxyl group is superior to the aliphatic chains in the secondary or tertiary carbon atom structure, the thermal-oxidative aging property of the high-speed electronic circuit substrate prepared therefrom is superior to that of the multifunctional acrylate group-modified thermosetting polyphenyl ether resin of which the active group, i.e., the acrylate groups are all grafted onto the aliphatic chains such as the secondary or tertiary carbon atoms, so that the dielectric constant and the dielectric loss of the high-speed electronic circuit substrate prepared therefrom can maintain better stability during a long-term use.

DETAILED DESCRIPTION

The technical solutions of the present disclosure will be further described below by way of specific embodiments.

Synthesis of Tetrafunctional Methyl Methacrylate Group-Modified Thermosetting Polyphenyl Ether PPO-1:

32.4 g of methylphenol, 24.4 g of 2,6-dimethylphenol, 50.0 g of aqueous formaldehyde solution (formaldehyde content of 24 wt %) and 1.0 g of aqueous hydrochloric acid solution (HCl content of 32 wt %) were charged into a four-necked reaction flask equipped with a mechanical stirrer and a condenser, then heated to 80 to 90° C. The reaction mixture was washed with water for three times after reacted for 6 hours, then distilled under reduced pressure to remove water. The reaction mixture was cooled to 50° C., 125 g of polyphenyl ether (number average molecular weight=2500) and 300 g of toluene were added, the mixture was heated to 80 to 90° C., to which 2 g of benzoyl peroxide was added in portions, the reaction mixture was washed with water for three times after reacted for 8 hours, then distilled under reduced pressure to remove toluene and water, the number average molecular weight of polyphenyl ether was 1540 as measured by GPC. The resulting polyphenyl ether was dissolved in toluene solution (polyphenyl ether content of 40 wt %), then 5.0 g of 4-dimethylaminopyridine as a catalyst was added. After the catalyst was dissolved, 77 g (0.5 mol) of methacrylic anhydride was added, the temperature was controlled at 80 to 85° C., and toluene was distilled off under reduced pressure after the reaction was conducted for 2 hours. The number average molecular weight of the obtained multifunctional methyl methacrylate group-modified thermosetting polyphenyl ether resin PPO-1 was 1900 as measured by GPC.

Synthesis of Tetrafunctional Methyl Methacrylate Group-Modified Thermosetting Polyphenyl Ether PPO-2:

32.4 g of methylphenol, 24.4 g of 2,6-dimethylphenol, 50.0 g of aqueous formaldehyde solution (formaldehyde content of 24 wt %) and 1.0 g of aqueous hydrochloric acid solution (HCl content of 32 wt %) were charged into a four-necked reaction flask equipped with a mechanical stirrer and a condenser, then heated to 80 to 90° C. The reaction mixture was washed with water for three times after reacted for 6 hours, then distilled under reduced pressure to remove water. The reaction mixture was cooled to 50° C., 125 g of polyphenyl ether (number average molecular weight=10000) and 300 g of toluene were added, the mixture was heated to 80 to 90° C., to which 2 g of benzoyl peroxide was added in portions, the reaction mixture was washed with water for three times after reacted for 8 hours, then distilled under reduced pressure to remove toluene and water, the number average molecular weight of polyphenyl ether was 7000 as measured by GPC. The resulting polyphenyl ether was dissolved in toluene solution (polyphenyl ether content of 40 wt %), then 5.0 g of 4-dimethylaminopyridine as a catalyst was added. After the catalyst was dissolved, 77 g (0.5 mol) of methacrylic anhydride was added, the temperature was controlled at 80 to 85° C., and toluene was distilled off under reduced pressure after the reaction was conducted for 2 hours. The number average molecular weight of the obtained multifunctional methyl methacrylate group-modified thermosetting polyphenyl ether resin PPO-2 was 7500 as measured by GPC.

Synthesis of Tetrafunctional Methyl Methacrylate Group-Modified Thermosetting Polyphenyl Ether PPO-3:

32.4 g of methylphenol, 24.4 g of 2,6-dimethylphenol, 50.0 g of aqueous formaldehyde solution (formaldehyde content of 24 wt %) and 1.0 g of aqueous hydrochloric acid solution (HCl content of 32 wt %) were charged into a four-necked reaction flask equipped with a mechanical stirrer and a condenser, then heated to 80 to 90° C. The reaction mixture was washed with water for three times after reacted for 6 hours, then distilled under reduced pressure to remove water. The reaction mixture was cooled to 50° C., 125 g of polyphenyl ether (number average molecular weight=15000) and 300 g of toluene were added, the mixture was heated to 80 to 90° C., to which 2 g of benzoyl peroxide was added in portions, the reaction mixture was washed with water for three times after reacted for 8 hours, then distilled under reduced pressure to remove toluene and water, the number average molecular weight of polyphenyl ether was 10000 as measured by GPC. The resulting polyphenyl ether was dissolved in toluene solution (polyphenyl ether content of 40 wt %), then 5.0 g of 4-dimethylaminopyridine as a catalyst was added. After the catalyst was dissolved, 77 g (0.5 mol) of methacrylic anhydride was added, the temperature was controlled at 80 to 85° C., and toluene was distilled off under reduced pressure after the reaction was conducted for 2 hours. The number average molecular weight of the obtained multifunctional methyl methacrylate group-modified thermosetting polyphenyl ether resin PPO-3 was 10600 as measured by GPC.

Synthesis of Hexafunctional Methyl Methacrylate Group-Modified Thermosetting Polyphenyl Ether PPO-4:

64.8 g of methylphenol, 24.4 g of 2,6-dimethylphenol, 100.0 g of aqueous formaldehyde solution (formaldehyde content of 24 wt %) and 1.0 g of aqueous hydrochloric acid solution (HCl content of 32 wt %) were charged into a four-necked reaction flask equipped with a mechanical stirrer and a condenser, then heated to 80 to 90° C. The reaction mixture was washed with water for three times after reacted for 6 hours, then distilled under reduced pressure to remove water. The reaction mixture was cooled to 50° C., 125 g of polyphenyl ether (number average molecular weight=2500) and 300 g of toluene were added, the mixture was heated to 80 to 90° C., to which 2 g of benzoyl peroxide was added in portions, the reaction mixture was washed with water for three times after reacted for 8 hours, then distilled under reduced pressure to remove toluene and water, the number average molecular weight of polyphenyl ether was 1700 as measured by GPC. The resulting polyphenyl ether was dissolved in toluene solution (polyphenyl ether content of 40 wt %), then 5.0 g of 4-dimethylaminopyridine as a catalyst was added. After the catalyst was dissolved, 154 g (1.0 mol) of methacrylic anhydride was added, the temperature was controlled at 80 to 85° C., and toluene was distilled off under reduced pressure after the reaction was conducted for 2 hours. The number average molecular weight of the obtained multifunctional methyl methacrylate group-modified thermosetting polyphenyl ether resin PPO-4 was 2100 as measured by GPC.

Synthesis of Decafunctional Methyl Methacrylate Group-Modified Thermosetting Polyphenyl Ether PPO-5:

129.6 g of methylphenol, 24.4 g of 2,6-dimethylphenol, 200.0 g of aqueous formaldehyde solution (formaldehyde content of 24 wt %) and 1.0 g of aqueous hydrochloric acid solution (HCl content of 32 wt %) were charged into a four-necked reaction flask equipped with a mechanical stirrer and a condenser, then heated to 80 to 90° C. The reaction mixture was washed with water for three times after reacted for 6 hours, then distilled under reduced pressure to remove water. The reaction mixture was cooled to 50° C., 125 g of polyphenyl ether (number average molecular weight=2500) and 300 g of toluene were added, the mixture was heated to 80 to 90° C., to which 2 g of benzoyl peroxide was added in portions, the reaction mixture was washed with water for three times after reacted for 8 hours, then distilled under reduced pressure to remove toluene and water, the number average molecular weight of polyphenyl ether was 2200 as measured by GPC. The resulting polyphenyl ether was dissolved in toluene solution (polyphenyl ether content of 40 wt %), then 5.0 g of 4-dimethylaminopyridine as a catalyst was added. After the catalyst was dissolved, 308 g (2.0 mol) of methacrylic anhydride was added, the temperature was controlled at 80 to 85° C., and toluene was distilled off under reduced pressure after the reaction was conducted for 2 hours. The number average molecular weight of the obtained multifunctional methyl methacrylate group-modified thermosetting polyphenyl ether resin PPO-5 was 2700 as measured by GPC.

Synthesis of Tetradecafunctional Methyl Methacrylate Group-Modified Thermosetting Polyphenyl Ether PPO-6:

194.4 g of methylphenol, 24.4 g of 2,6-dimethylphenol, 300.0 g of aqueous formaldehyde solution (formaldehyde content of 24 wt %) and 1.0 g of aqueous hydrochloric acid solution (HCl content of 32 wt %) were charged into a four-necked reaction flask equipped with a mechanical stirrer and a condenser, then heated to 80 to 90° C. The reaction mixture was washed with water for three times after reacted for 6 hours, then distilled under reduced pressure to remove water. The reaction mixture was cooled to 50° C., 125 g of polyphenyl ether (number average molecular weight=2500) and 300 g of toluene were added, the mixture was heated to 80 to 90° C., to which 2 g of benzoyl peroxide was added in portions, the reaction mixture was washed with water for three times after reacted for 8 hours, then distilled under reduced pressure to remove toluene and water, the number average molecular weight of polyphenyl ether was 2800 as measured by GPC. The resulting polyphenyl ether was dissolved in toluene solution (polyphenyl ether content of 40 wt %), then 5.0 g of 4-dimethylaminopyridine as a catalyst was added. After the catalyst was dissolved, 462 g (3.0 mol) of methacrylic anhydride was added, the temperature was controlled at 80 to 85° C., and toluene was distilled off under reduced pressure after the reaction was conducted for 2 hours. The number average molecular weight of the obtained multifunctional methyl methacrylate group-modified thermosetting polyphenyl ether resin PPO-6 was 3200 as measured by GPC.

Synthesis of Hexafunctional Methyl Methacrylate Group-Modified Thermosetting Polyphenyl Ether PPO-7:

A four-necked reaction flask equipped with a mechanical stirrer and a condenser was heated to 100° C. 300 g of polyphenyl ether (number average molecular weight of 1100) and 1168 g of epichlorohydrin were added thereto. 34.4 g of sodium ethoxide was dissolved in 120 g of ethanol and then added dropwise to the reaction flask over 60 minutes. After reacting for 5 hours with stirring, the product was washed with pure water to remove impurities such as salts. The excess epichlorohydrin was then removed by distillation under reduced pressure. After drying, 330 g of epoxidation-modified polyphenyl ether having a number average molecular weight of 1210 was obtained.

To a four-necked reaction flask equipped with a mechanical stirrer and a condenser, 330 g of epoxidation-modified polyphenyl ether, 32 g of methacrylic acid, 160 g of toluene, 1.0 g of triethylamine and 1 mg of hydroquinone methyl ether were added. The mixture was heated to 120° C., the acid value was tested while stirring to react until the acid value of the solution reached 2 mg KOH/g. The solution obtained from the reaction was added dropwise to a methanol solution to precipitate, and filtered to obtain a solid product, which was dried under reduced pressure to obtain 250 g of an epoxymethacrylate modified polyphenyl ether having a number average molecular weight of 1700.

To a four-necked reaction flask equipped with a mechanical stirrer and a condenser, 250 g of epoxymethylate modified polyphenyl ether, 54 g of triethylamine and 4000 g of dichloromethane were added. The reaction flask was cooled to 0° C., 49 g of methacryloyl chloride was dissolved in 1000 g of dichloromethane, the resulting solution was added dropwise to the reaction flask over 60 minutes, and then the reaction temperature was raised to room temperature, and the reaction was stirred for 2 hours. The mixture was washed with pure water, and the organic layer was added dropwise to a methanol solution to precipitate. The precipitate was dried under reduced pressure to obtain 200 g of a hexafunctional methacrylate group-modified thermosetting polyphenyl ether PPO-7 having a number average molecular weight of 2000.

The molecular structure of PPO-7 was shown in the following formula (8):

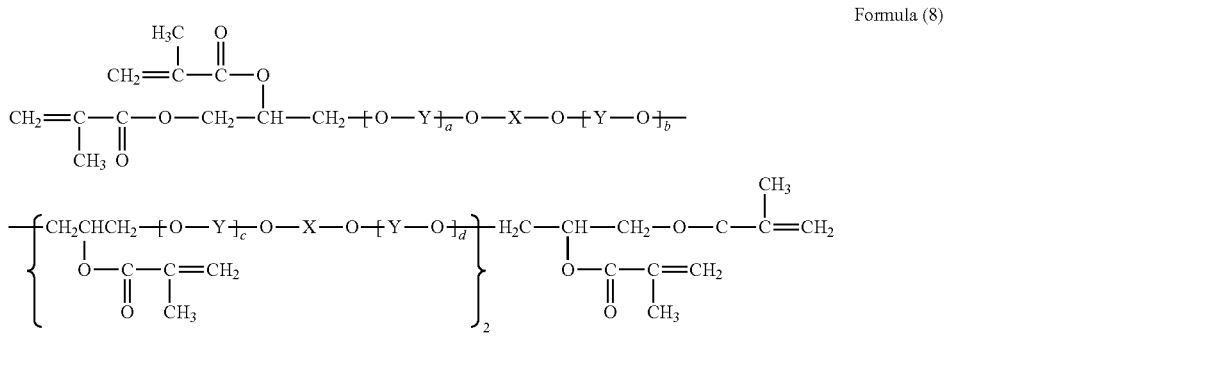

Formula (8)

X has a structure shown by formula (9):

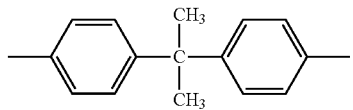

Formula (9)

Y has a structure shown by formula (10):

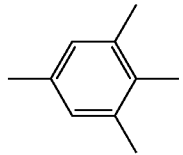

Formula (10)

The raw materials selected for preparing the high-speed electronic circuit substrate in the examples of the present disclosure are shown in the following table:

TABLE 1

| Manufacturer | Product name or Brand name | Description of the materials |
| --- | --- | --- |
| Self-prepared | PPO-1 (number average molecular weight of 1900) | Tetrafunctional methyl methacrylate group-modified thermosetting polyphenyl ether resin |
| Self-prepared | PPO-2 (number average molecular weight of 7500) | Tetrafunctional methyl methacrylate group-modified thermosetting polyphenyl ether resin |
| Self-prepared | PPO-3 (number average molecular weight of 10600) | Tetrafunctional methyl methacrylate group-modified thermosetting polyphenyl ether resin |
| Self-prepared | PPO-4 (number average molecular weight of 2100) | Hexafunctional methyl methacrylate group-modified thermosetting polyphenyl ether resin |
| Self-prepared | PPO-5 (number average molecular weight of 2700) | Decafunctional methyl methacrylate group-modified thermosetting polyphenyl ether resin |
| Self-prepared | PPO-6 (number average molecular weight of 3200) | Tetradecafunctional methyl methacrylate group-modified thermosetting polyphenyl ether resin |
| Self-prepared | PPO-7 (number average molecular weight of 2000) | Hexafunctional methyl methacrylate group-modified thermosetting polyphenyl ether resin |
| Sabic | SA9000 (number average molecular weight of 1900) | Bifunctional methyl methacrylate group-modified thermosetting polyphenyl ether resin |
| Samtomer | Ricon100 | Styrene-butadiene copolymer |
| Nippon Soda | B-1000 | Polybutadiene |
| Shanghai Gaoqiao | DCP | Dicumyl peroxide |
| Dongguan Sonic Chemical | BPO | Dibenzoyl peroxide |
| Sibelco | 525 | Fused silica powder |
| Albemarle Corporation | BT-93W | Bromine-containing flame retardant |
| Albemarle Corporation | XP-7866 | Phosphorous-containing flame retardant |
| Shanhai Honghe | 2116 | Glass fiber cloth |

Example 1

50 g parts by weight of tetrafunctional methyl methacrylate group-modified thermosetting polyphenyl ether resin PPO-1, 20 g parts by weight of styrene-butadiene copolymer Ricon100, and 1.5 parts by weight of a curing initiator DCP were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 2.

Example 2

50 g parts by weight of tetrafunctional methyl methacrylate group-modified thermosetting polyphenyl ether resin PPO-1, 30 g parts by weight of styrene-butadiene copolymer Ricon100, and 1.5 parts by weight of a curing initiator DCP were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 2.

Example 3

50 g parts by weight of tetrafunctional methyl methacrylate group-modified thermosetting polyphenyl ether resin PPO-1, 50 g parts by weight of styrene-butadiene copolymer Ricon100, and 1.5 parts by weight of a curing initiator DCP were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 2.

Example 4

50 g parts by weight of tetrafunctional methyl methacrylate group-modified thermosetting polyphenyl ether resin PPO-1, 30 g parts by weight of styrene-butadiene copolymer Ricon100, 1.5 parts by weight of a curing initiator DCP, 15.0 g parts by weight of bromine-containing flame retardant BT-93W, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 2.

Example 5

50 g parts by weight of tetrafunctional methyl methacrylate group-modified thermosetting polyphenyl ether resin PPO-2, 30 g parts by weight of styrene-butadiene copolymer Ricon100, 1.5 parts by weight of a curing initiator DCP, 15.0 g parts by weight of bromine-containing flame retardant BT-93W, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Due to the large molecular weight of PPO-2, the viscosity of the glue was larger, so that the wettability of the adhesive sheet was affected to a certain extent, Physical properties were as shown in Table 2.

Example 6

50 g parts by weight of tetrafunctional methyl methacrylate group-modified thermosetting polyphenyl ether resin PPO-3, 30 g parts by weight of styrene-butadiene copolymer Ricon100, 1.5 parts by weight of a curing initiator DCP, 15.0 g parts by weight of bromine-containing flame retardant BT-93W, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Due to the large molecular weight of PPO-3, the viscosity of the glue was large, so that the wettability of the adhesive sheet was affected to a certain extent. Physical properties were as shown in Table 2.

Example 7

50 g parts by weight of tetrafunctional methyl methacrylate group-modified thermosetting polyphenyl ether resin PPO-1, 30 g parts by weight of styrene-butadiene copolymer Ricon100, 1.5 parts by weight of a curing initiator DCP, 15.0 g parts by weight of phosphorous-containing flame retardant XP-7866, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 3.

Example 8

50 g parts by weight of hexafunctional methyl methacrylate group-modified thermosetting polyphenyl ether resin PPO-4, 30 g parts by weight of styrene-butadiene copolymer Ricon100, 1.5 parts by weight of a curing initiator DCP, 15.0 g parts by weight of phosphorous-containing flame retardant XP-7866, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 3.

Example 9

50 g parts by weight of decafunctional methyl methacrylate group-modified thermosetting polyphenyl ether resin PPO-5, 30 g parts by weight of styrene-butadiene copolymer Ricon100, 1.5 parts by weight of a curing initiator DCP, 15.0 g parts by weight of phosphorous-containing flame retardant XP-7866, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 3.

Example 10

50 g parts by weight of tetradecafunctional methyl methacrylate group-modified thermosetting polyphenyl ether resin PPO-6, 30 g parts by weight of styrene-butadiene copolymer Ricon100, 1.5 parts by weight of a curing initiator DCP, 15.0 g parts by weight of bromine-containing flame retardant BT-93W, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained, Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 3.

Example 11

50 g parts by weight of tetrafunctional methyl methacrylate group-modified thermosetting polyphenyl ether resin PPO-1, 30 g parts by weight of polybutadiene B-1000, 1.5 parts by weight of a curing initiator BPO, 15.0 g parts by weight of phosphorous-containing flame retardant XP-7866, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained, Physical properties were as shown in Table 3.

Comparative Example 1

50 g parts by weight of hexafunctional methyl methacrylate group-modified thermosetting polyphenyl ether resin PPO-7, 30 g parts by weight of styrene-butadiene Ricon100, 1.5 parts by weight of a curing initiator DCP, 15.0 g parts by weight of phosphorous-containing flame retardant XP-7866, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 4.

Comparative Example 2

50 g parts by weight of bifunctional methyl methacrylate group-modified thermosetting polyphenyl ether resin SA9000, 30 g parts by weight of styrene-butadiene copolymer Ricon100, 1.5 parts by weight of a curing initiator DCP, 15.0 g parts by weight of bromine-containing flame retardant BT-93W, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 4.

Comparative Example 3

50 g parts by weight of bifunctional methyl methacrylate group-modified thermosetting polyphenyl ether resin SA9000, 10 g parts by weight of styrene-butadiene copolymer Ricon100, 1.5 parts by weight of a curing initiator DCP, 15.0 g parts by weight of bromine-containing flame retardant BT-93W, and 25.0 g of fused silica powder 525 were dissolved in toluene solvent and adjusted to a suitable viscosity. A 2116 glass fiber cloth was soaked with the glue, a suitable piece weight was controlled through a clamp shaft, and the cloth was baked in an oven to remove the toluene solvent, so that a 2116 adhesive sheet was obtained. Four 2116 adhesive sheets were overlapped with copper foils having a thickness of 10Z disposed on both top and bottom sides, vacuum laminated and cured in a press for 90 minutes, the curing pressure was 50 Kg/cm$^2$ and the curing temperature was 200° C., so that a high-speed electronic circuit substrate was obtained. Physical properties were as shown in Table 4.

TABLE 2

| The raw materials and properties | Example 1 | Example 2 | Example 3 | Example 4 | Example 5 | Example 6 |
|---|---|---|---|---|---|---|
| PPO-1 | 50 | 50 | 50 | 50 | 0 | 0 |
| PPO-2 | 0 | 0 | 0 | 0 | 50 | 0 |
| PPO-3 | 0 | 0 | 0 | 0 | 0 | 50 |
| PPO-4 | 0 | 0 | 0 | 0 | 0 | 0 |
| PPO-5 | 0 | 0 | 0 | 0 | 0 | 0 |
| PPO-6 | 0 | 0 | 0 | 0 | 0 | 0 |
| PPO-7 | 0 | 0 | 0 | 0 | 0 | 0 |
| SA9000 | 0 | 0 | 0 | 0 | 0 | 0 |
| Ricon100 | 20 | 30 | 50 | 30 | 30 | 30 |
| B-1000 | 0 | 0 | 0 | 0 | 0 | 0 |
| DCP | 1.5 | 1.5 | 1.5 | 1.5 | 1.5 | 1.5 |
| BPO | 0 | 0 | 0 | 0 | 0 | 0 |
| BT-93W | 0 | 0 | 0 | 15 | 15 | 15 |
| XP-7866 | 0 | 0 | 0 | 0 | 0 | 0 |
| 525 | 0 | 0 | 0 | 25 | 25 | 25 |
| Dielectric constant (10 GHz) | 3.7 | 3.6 | 3.5 | 3.8 | 3.8 | 3.8 |
| Dielectric loss (10 GHz) | 0.0052 | 0.0048 | 0.0042 | 0.0048 | 0.0048 | 0.0048 |
| Thermal-oxidative aging resistance 150° C./56 day Absolute value of change in Dk | 0.3 | 0.2 | 0.3 | 0.2 | 0.3 | 0.3 |
| Thermal-oxidative aging resistance 150° C./56 day Absolute value of change in Df | 0.004 | 0.003 | 0.004 | 0.003 | 0.004 | 0.004 |

TABLE 3

| The raw materials and properties | Example 7 | Example 8 | Example 9 | Example 10 | Example 11 |
|---|---|---|---|---|---|
| PPO-1 | 50 | 0 | 0 | 0 | 50 |
| PPO-2 | 0 | 0 | 0 | 0 | 0 |
| PPO-3 | 0 | 0 | 0 | 0 | 0 |
| PPO-4 | 0 | 50 | 0 | 0 | 0 |
| PPO-5 | 0 | 0 | 50 | 0 | 0 |
| PPO-6 | 0 | 0 | 0 | 50 | 0 |
| PPO-7 | 0 | 0 | 0 | 0 | 0 |
| SA9000 | 0 | 0 | 0 | 0 | 0 |
| Ricon100 | 30 | 30 | 30 | 30 | 0 |
| B-1000 | 0 | 0 | 0 | 0 | 30 |
| DCP | 1.5 | 1.5 | 1.5 | 1.5 | 0 |
| BPO | 0 | 0 | 0 | 0 | 1.5 |
| BT-93W | 0 | 0 | 0 | 15 | 0 |
| XP-7866 | 15 | 15 | 15 | 0 | 15 |
| 525 | 25 | 25 | 25 | 25 | 25 |
| Dielectric constant (10 GHz) | 3.8 | 3.8 | 3.8 | 3.8 | 3.8 |
| Dielectric loss (10 GHz) | 0.0048 | 0.0048 | 0.0048 | 0.0048 | 0.0048 |
| Thermal-oxidative aging resistance 150° C./56 day Absolute value of change in Dk | 0.2 | 0.1 | 0.2 | 0.4 | 0.2 |

TABLE 3-continued

| The raw materials and properties | Example 7 | Example 8 | Example 9 | Example 10 | Example 11 |
|---|---|---|---|---|---|
| Thermal-oxidative aging resistance 150° C./56 day Absolute value of change in Df | 0.003 | 0.002 | 0.003 | 0.004 | 0.003 |

TABLE 4

| The raw materials and properties | Comparative Example 1 | Comparative Example 2 | Comparative Example 3 |
|---|---|---|---|
| PPO-1 | 0 | 0 | 0 |
| PPO-2 | 0 | 0 | 0 |
| PPO-3 | 0 | 0 | 0 |
| PPO-4 | 0 | 0 | 0 |
| PPO-5 | 0 | 0 | 0 |
| PPO-6 | 0 | 0 | 0 |
| PPO-7 | 50 | 0 | 0 |
| SA9000 | 0 | 50 | 50 |
| Ricon100 | 30 | 30 | 10 |
| B-1000 | 0 | 0 | 0 |
| DCP | 1.5 | 1.5 | 1.5 |
| BPO | 0 | 0 | 0 |
| BT-93W | 0 | 15 | 15 |
| XP-7866 | 15 | 0 | 0 |
| 525 | 25 | 25 | 25 |
| Dielectric constant (10 GHz) | 3.8 | 3.8 | 4.1 |
| Dielectric loss (10 GHz) | 0.0048 | 0.0048 | 0.009 |
| Thermal-oxidative aging resistance 150° C./56 day Absolute value of change in Dk | 0.4 | 0.4 | 0.1 |
| Thermal-oxidative aging resistance 150° C./56 day Absolute value of change in Df | 0.006 | 0.009 | 0.002 |

When compared with Example 8, Comparative Example 1 employs the multifunctional acrylate group-modified thermosetting polyphenyl ether resin PPO-7 of which the active groups, i.e., the methacrylate groups are all grafted onto the aliphatic chains such as the secondary or tertiary carbon atoms, resulting in the poor thermal-oxidative aging resistance of the substrate obtained in Comparative Example 1, and the poor stability of the dielectric constant and the dielectric loss during a long-term use. When compared with Example 4, Comparative Example 2 employs a methyl methacrylate group-modified thermosetting polyphenyl ether resin SA9000 with low functionality, due to its limited active groups, the excess double bonds on the side chains of the vinyl resin crosslinking agent such as polybutadiene cannot completely react. The incompletely reacted double bonds on the side chains of the vinyl resin crosslinking agent such as polybutadiene have poor thermal-oxidative aging resistance, which can seriously affect the stability of the dielectric constant and the dielectric loss of the substrate during a long-term use, thereby deteriorating the signal integrity of the substrate. Therefore, with respect to the multifunctional acrylate group-modified polyphenyl ether resin of which the bifunctional group or the active group acrylate group are all grafted onto the aliphatic chains such as the secondary or tertiary carbon atoms, the electronic circuit substrate prepared by use of the multifunctional acrylate group-modified thermosetting polyphenyl ether resin of the present disclosure not only has a low dielectric constant and dielectric loss, but also has a better thermal-oxidative aging resistance, ensuring that the dielectric constant and the dielectric loss of the substrate can maintain better stability during a long-term use.

In addition, it can be found by the comparison between Comparative Example 1 and Example 8, and the comparison between Comparative Example 3 and Example 4 that use of an appropriate amount of the vinyl resin to crosslink and cure the multifunctional acrylate group-modified thermosetting polyphenyl ether resin PPO-7 of which the active group, i.e., the acrylate groups are all grafted onto the aliphatic chains such as the secondary or tertiary carbon atoms, or use of a smaller amount of a vinyl resin to crosslink and cure methyl acrylate group-modified thermosetting polyphenyl ether resin SA9000 with low functionality cannot achieve the low dielectric constant and dielectric loss, as well as the excellent thermal-oxidative aging resistance simultaneously. A cooperation between the thermosetting polyphenyl ether resin in a specific structure and the vinyl resin crosslinking agent in a specified content is a necessary condition to achieve the low dielectric constant and dielectric loss, as well as the excellent thermal-oxidative aging resistance simultaneously.

Applicant has stated that although the detailed methods of the present disclosure have been described by the above examples in the present disclosure, the present disclosure is not limited thereto, that is to say, it is not meant that the present disclosure has to be implemented depending on the above detailed methods. It will be apparent to those skilled in the art that any improvements made to the present disclosure, equivalent replacements and addition of adjuvant ingredients to the raw materials of the products of the present disclosure, and selections of the specific implementations, etc., all fall within the protection scope and the disclosure scope of the present disclosure.

The invention claimed is:

1. A polyphenyl ether resin composition, it comprises the following components:
  (1) a tetrafunctional or higher multifunctional acrylate group-modified thermosetting polyphenyl ether resin; and
  (2) a vinyl resin crosslinking agent, the weight of which is 40 to 100 parts by weight, based on 100 parts by weight of the tetrafunctional or higher multifunctional acrylate group-modified thermosetting polyphenyl ether resin;
  wherein the tetrafunctional or higher multifunctional acrylate group-modified thermosetting polyphenyl ether resin has a structure shown by formula (1):

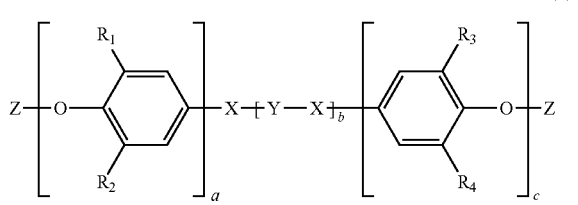

Formula (1)

in formula (1), $R_1$, $R_2$, $R_3$ and $R_4$ are the same or different and are each independently a hydrogen atom, a halogen atom, a substituted or unsubstituted C1-C8 alkyl group or a substituted or unsubstituted aryl group;
a and c are each independently an integer from 1 to 15 and b is an integer from 2 to 10;
Z has a structure shown by formula (2):

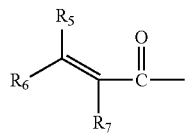

Formula (2)

in formula (2), $R_5$, $R_6$, and $R_7$ are the same or different and are each independently a hydrogen atom or a substituted or unsubstituted C1-C10 alkyl group;
X has a structure shown by formula (3), formula (4), formula (5), or formula (6):

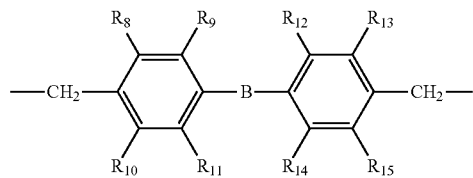

Formula (3)

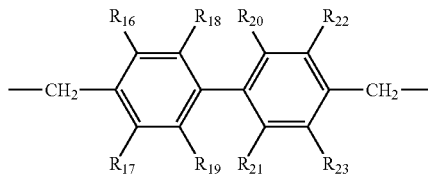

Formula (4)

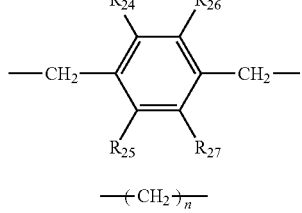

Formula (5)

Formula (6)

—(CH$_2$)$_n$—

$R_8$, $R_9$, $R_{10}$, $R_{11}$, $R_{12}$, $R_{13}$, $R_{14}$, $R_{15}$, $R_{16}$, $R_{17}$, $R_{18}$, $R_{19}$, $R_{20}$, $R_{21}$, $R_{22}$, $R_{23}$, $R_{24}$, $R_{25}$, $R_{26}$ and $R_{27}$ are the same or different and are each independently a hydrogen atom, a halogen atom, a substituted or unsubstituted C1-C8 alkyl group or a substituted or unsubstituted aryl group; and n is an integer from 1 to 10;

B is an alkylene group, —O—, —CO—, —SO—, —SC—, —SO$_2$— or —C(CH$_3$)$_2$—;
Y has a structure shown by formula (7) or formula (8):

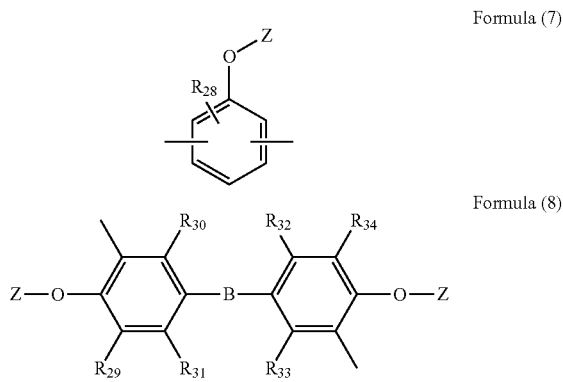

Formula (7)

Formula (8)

$R_{28}$, $R_{29}$, $R_{30}$, $R_{31}$, $R_{32}$, $R_{33}$ and $R_{34}$ are the same or different and are each independently a hydrogen atom, a halogen atom, a substituted or unsubstituted C1-C8 alkyl group or a substituted or unsubstituted aryl group.

2. The polyphenyl ether resin composition according to claim 1, wherein b is an integer from 4 to 6.

3. The polyphenyl ether resin composition according to claim 1, wherein the weight of the vinyl resin crosslinking agent is 50 to 80 parts by weight, based on 100 parts by weight of the tetrafunctional or higher multifunctional acrylate group-modified thermosetting polyphenyl ether resin.

4. The polyphenyl ether resin composition according to claim 1, wherein the number average molecular weight of the tetrafunctional or higher multifunctional acrylate group-modified thermosetting polyphenyl ether resin is 500 to 10000 g/mol.

5. The polyphenyl ether resin composition according to claim 4, the vinyl resin crosslinking agent is at least one member selected from a group consisting of a styrene-butadiene copolymer, a polybutadiene and a styrene-butadiene-divinylbenzene copolymer.

6. The polyphenyl ether resin composition according to claim 5, the styrene-butadiene copolymer, the polybutadiene or the styrene-butadiene-divinylbenzene copolymer are independently amino-modified, maleic anhydride-modified, epoxy-modified, acrylate-modified, hydroxyl-modified or carboxyl-modified.

7. The polyphenyl ether resin composition according to claim 1, wherein the polyphenyl ether resin composition further comprises an initiator, and the initiator is a radical initiator.

8. The polyphenyl ether resin composition according to claim 7, the radical initiator is an organic peroxide initiator.

9. The polyphenyl ether resin composition according to claim 8, the radical initiator is at least one member selected from a group consisting of dilauroyl peroxide, dibenzoyl peroxide, cumyl peroxyneodecanoate, t-butyl peroxyneodecanoate, t-amyl peroxypivalate, t-butyl peroxypivalate, t-butyl peroxyisobutyrate, t-butyl peroxy-3,5,5-trimethylhexanoate, t-butyl peroxyacetate, t-butyl peroxybenzoate, 1,1-di-t-butylperoxy-3,5,5-trimethylcyclohexane, 1,1-di-t-butylperoxycyclohexane, 2,2-bis (t-butylperoxy)butane, bis (4-tert-butylcyclohexyl) peroxydicarbonate, hexadecyl peroxodicarbonate, tetradecyl peroxydicarbonate, di-t-amyl peroxide, dicumyl peroxide, bis(t-butylperoxyisopropyl)benzene, 2,5-dimethyl-2,5-di-t-butylperoxyhexane, 2,5-dimethyl-2,5-di-t-butylperoxyhexyne, dicumyl hydroperoxide, cumyl hydroperoxide, t-amyl hydroperoxide, t-butyl hydroperoxide, t-butyl cumyl peroxide, dicumyl hydroperoxide, t-butyl peroxycarbonate 2-ethylhexanoate, 2-ethylhexyl-t-butylperoxycarbonate, n-butyl 4,4-di(t-butylperoxy) pentanoate, methyl ethyl ketone peroxide and cyclohexane peroxide.

10. The polyphenyl ether resin composition according to claim 7, the weight of the initiator is 1 to 3 parts by weight, based on 100 parts by weight of a sum of the weight of the tetrafunctional or higher multifunctional acrylate group-modified thermosetting polyphenyl ether resin and the vinyl resin crosslinking agent.

11. The polyphenyl ether resin composition according to claim 1, wherein the polyphenyl ether resin composition further comprises a flame retardant.

12. The polyphenyl ether resin composition according to claim 11, the flame retardant comprises at least one member selected from the group consisting of a bromine-containing flame retardant and a phosphorus-containing flame retardant.

13. The polyphenyl ether resin composition according to claim 11, the weight of the flame retardant is 0 to 40 parts by weight, based on 100 parts by weight of a sum of the weight of the tetrafunctional or higher multifunctional acrylate group-modified thermosetting polyphenyl ether resin, the vinyl resin crosslinking agent and the initiator.

14. The polyphenyl ether resin composition according to claim 11, the polyphenyl ether resin composition further comprises a powder filler.

15. The polyphenyl ether resin composition according to claim 14, the powder filler comprises at least one member selected from the group consisting of an organic filler and an inorganic filler.

16. The polyphenyl ether resin composition according to claim 15, wherein the inorganic filler is at least one member selected from a group consisting of crystalline silica, fused silica, spherical silica, hollow silica, glass frit, aluminum nitride, boron nitride, silicon carbide, aluminum silicon carbide, aluminum hydroxide, magnesium hydroxide, titanium dioxide, strontium titanate, barium titanate, zinc oxide, zirconium oxide, aluminum oxide, beryllium oxide, magnesium oxide, barium sulfate, talcum powder, clay, calcium silicate, calcium carbonate and mica.

17. The polyphenyl ether resin composition according to claim 15, the organic filler is at least one member selected from a group consisting of polytetrafluoroethylene powder, polyphenylene sulfide, polyetherimide, polyphenyl ether and polyether sulfone powder.

18. The polyphenyl ether resin composition according to claim 14, the weight of the powder filler is 0 to 150 parts by weight, based on 100 parts by weight of a sum of the weight of the tetrafunctional or higher multifunctional acrylate group-modified thermosetting polyphenyl ether resin, the vinyl resin crosslinking agent, the initiator and the flame retardant.

19. A prepreg comprising a reinforcing material and the polyphenyl ether resin composition according to claim 1 adhered thereon after being impregnated and dried.

20. A laminate comprising at least one prepreg according to claim 19.

* * * * *